United States Patent
Konno et al.

(10) Patent No.: US 9,064,969 B2
(45) Date of Patent: Jun. 23, 2015

(54) NONVOLATILE SEMICONDUCTOR MEMORY DEVICE AND METHOD OF FABRICATING THE SAME

(71) Applicant: Kabushiki Kaisha Toshiba, Minato-ku (JP)

(72) Inventors: Atsushi Konno, Mie-ken (JP); Masaru Kito, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/198,751

(22) Filed: Mar. 6, 2014

(65) Prior Publication Data

US 2015/0069498 A1    Mar. 12, 2015

(30) Foreign Application Priority Data

Sep. 10, 2013   (JP) .................................. 2013-187514

(51) Int. Cl.
*H01L 29/792* (2006.01)
*H01L 21/28* (2006.01)

(52) U.S. Cl.
CPC ........ *H01L 29/792* (2013.01); *H01L 21/28282* (2013.01)

(58) Field of Classification Search
CPC ..................... H01L 27/11582; H01L 29/7926
USPC .................................. 438/287, 268; 257/324
See application file for complete search history.

(56) References Cited

U.S. PATENT DOCUMENTS

| | | | |
|---|---|---|---|
| 7,579,232 B1 | 8/2009 | Ping et al. | |
| 8,372,720 B2 | 2/2013 | Fukuzumi et al. | |
| 8,669,608 B2 * | 3/2014 | Sato et al. ..................... | 257/324 |
| 2009/0194810 A1 | 8/2009 | Kiyotoshi et al. | |

FOREIGN PATENT DOCUMENTS

| | | |
|---|---|---|
| JP | 11-26436 | 1/1999 |
| JP | 2009-146954 | 7/2009 |
| JP | 2009-182270 | 8/2009 |
| JP | 2011-527832 | 11/2011 |

* cited by examiner

*Primary Examiner* — Mark Prenty
(74) *Attorney, Agent, or Firm* — Oblon, McClelland, Maier & Neustadt, L.L.P.

(57) ABSTRACT

According to an embodiment, in a method of fabricating a nonvolatile semiconductor memory device, second trenches penetrating the first and second conductive layers above the first trenches are formed to reach the stack, and a second insulating layer is formed on the second trenches and the first insulating layer so as to fill the second trenches. A part of the second insulating layer in a first region extending in a direction orthogonal to a direction that the first and second semiconductor pillars extend in a plane parallel to the back gate layer is removed while a part of the second insulating layer in a second region adjacent to the first region is left. The first sacrificial layer is selectively removed, and the first conductive layers and second conductive layers exposed in the first and second trenches are silicidized.

10 Claims, 22 Drawing Sheets

FIG. 20A
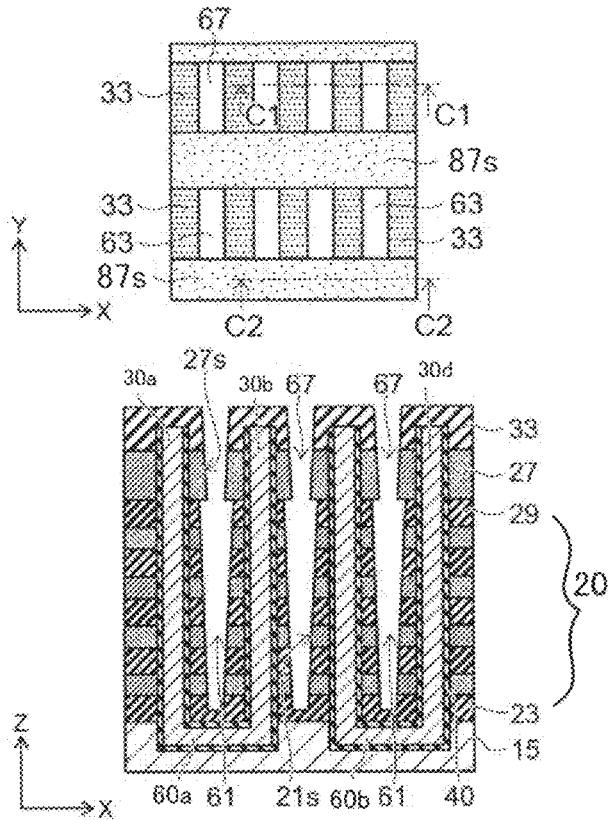
FIG. 20B
FIG. 20C
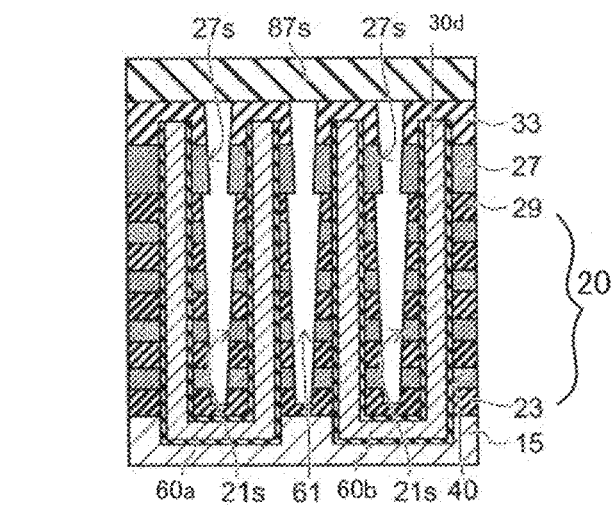

NONVOLATILE SEMICONDUCTOR MEMORY DEVICE AND METHOD OF FABRICATING THE SAME

CROSS REFERENCE TO RELATED APPLICATION

This application is based upon and claims the benefit of priority from the prior Japanese Patent Application No. 2013-187514, filed on Sep. 10, 2013, the entire contents of which are incorporated herein by reference.

FIELD

Embodiments described herein relate to a nonvolatile semiconductor memory device and a method of fabricating the nonvolatile semiconductor memory device.

BACKGROUND

Nonvolatile semiconductor memory devices represented by NAND flash memories are manufactured by using semiconductor wafer processes. The increase in capacity and reduction in power consumption and cost of the nonvolatile semiconductor memory devices have been realized with the progress of two-dimensional miniaturization techniques at wafer processes. On the other hand, storage devices that include a three-dimensional memory array having a plurality of memory layers laid on each other are being developed as next-generation nonvolatile memory devices. To increase the capacity of a three-dimensional memory cell array, it is necessary to miniaturize a plurality of word lines controlling memory cells and increase the number of stacks of the memory cell array. However, the miniaturization of word lines and high-level stacking could collapse the stacking structure of the memory cell array in some cases.

BRIEF DESCRIPTION OF THE DRAWINGS

FIGS. 20A to 20C are views illustrating the fabrication process of the nonvolatile semiconductor memory device according to the second embodiment;

DETAILED DESCRIPTION

Figure 1:
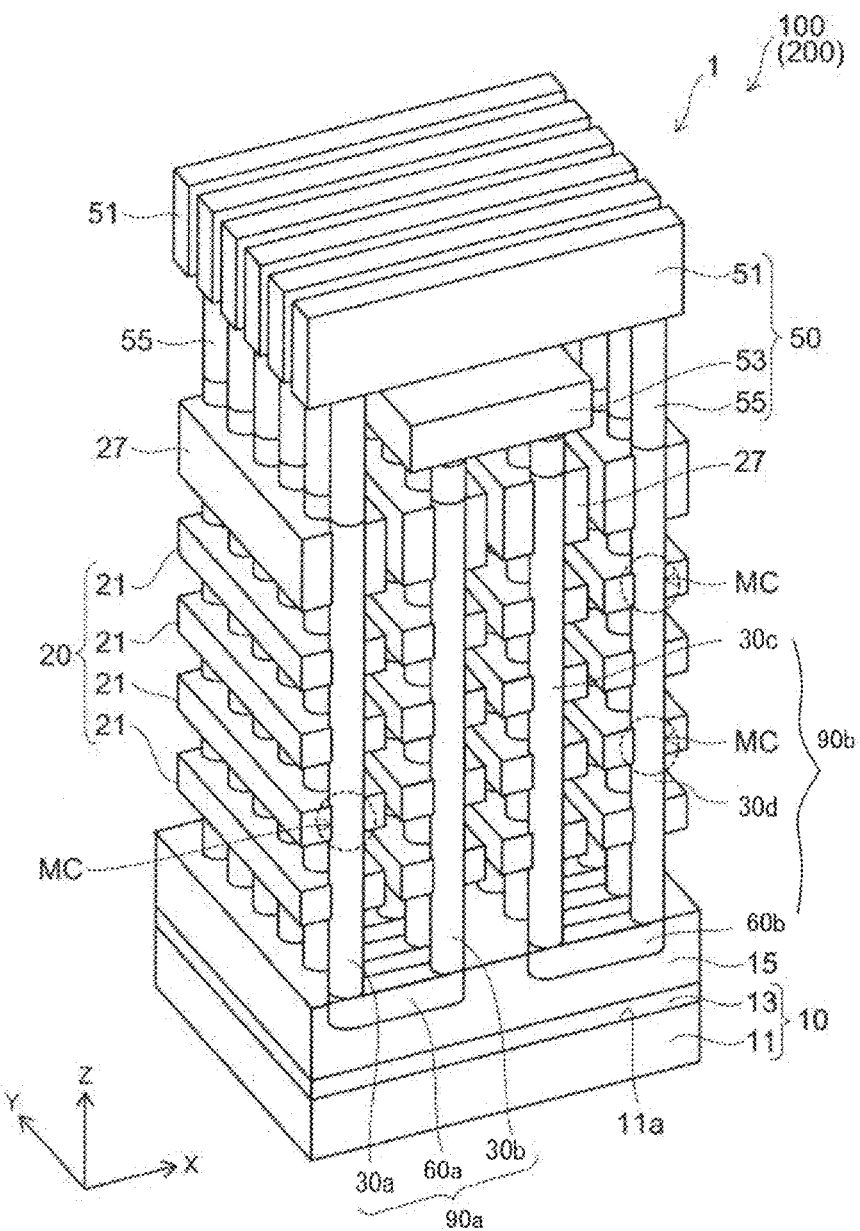
FIG. 1 is a perspective view illustrating a nonvolatile semiconductor memory device according to a first embodiment.

According to an embodiment, in a method of fabricating a nonvolatile semiconductor memory device, the nonvolatile semiconductor memory device includes a plurality of stacks, a second conductive layer and a plurality of the first memory strings. The stacks are arranged side by side in a first direction, and extend in a second direction orthogonal to the first direction, in a plane in parallel with a substrate, each stack includes a plurality of first conductive layers stacked above the substrate with insulating layers interposed between the first conductive layers. The second conductive layer is provided on the stack. The first memory strings include a first semiconductor pillar, a second semiconductor pillar and a first connection portion, respectively, the first and second semiconductor pillars penetrate each stack in a way to reach a back gate layer above the substrate, the first connection portion is provided in a surface of the back gate layer, one end of the first connection portion is connected to a lower end of the first semiconductor pillar, the other end of the first connection portion is connected to a lower end of the second semiconductor pillar, a memory layer is provided in an outer side portion of the first semiconductor pillar, the second semiconductor pillar and the first connection portion, a first semiconductor layer are provided in an inner side portion of the first semiconductor pillar, the second semiconductor pillar and the first connection portion, and the first memory strings are arranged side by side in the second direction. In the method of fabricating the nonvolatile semiconductor memory device, first, a first sacrificial layer is buried in each of a plurality of first trenches penetrating to the first conductive layer that is the lowest layer of the stack. A second conductive layer and a first insulating layer are laid on the stack and the first sacrificial layer. The first and second pillars are alternately formed between the pairs of first trenches adjacent to each other, and the first connection portion connecting the first and second semiconductor pillars is formed. Second trenches penetrating the first and second conductive layers above the first trenches are formed to reach the stack, and a second insulating layer is formed on the second trenches and the first insulating layer so as to fill the second trenches. A part of the second insulating layer in a first region extending in the first direction orthogonal to a third direction that the first and second semiconductor pillars extend is removed while a part of the second insulating layer in a second region adjacent to the first region in the second direction is left. The first sacrificial layer is selectively removed, and the first conductive layers and second conductive layers exposed in the first and second trenches are silicidized.

Hereinafter, embodiments of the invention will be described with reference to the drawings. Same portions are given same numerals in the drawings, and detailed description of the same portions is properly omitted. Only different portions will be described. The drawings are schematic or conceptual, and the relationship between thickness and width of each portion, the size proportions, and the like are not always equal to actual ones. Some portions are shown with different dimensions or proportions in different drawings.

A nonvolatile semiconductor memory device according to a first embodiment and a method of fabricating the nonvolatile semiconductor memory device will be described with reference to the drawings.

FIG. 1 is a perspective view illustrating a nonvolatile semiconductor memory device according to the first embodiment. As illustrated in FIG. 1, the nonvolatile semiconductor memory device 100 is a three-dimensional NAND flash memory and includes a three-dimensionally structured memory cell array 1.

FIG. 1 is a perspective view illustrating a part of the memory cell array 1. For easy understanding of the structure of the memory cell array 1, insulating layers are not shown. Actually, the components of the memory cell array 1 are isolated from one another by insulating layers.

As illustrated in FIG. 1, the nonvolatile semiconductor memory device 100 includes the memory cell array 1 provided on an underlying layer 10. The underlying layer 10 includes a substrate 11 and an interlayer insulating layer 13 provided on the substrate 11. On the underlying layer 10, a back gate layer 15 is provided. The memory cell array 1 includes memory strings 90a and memory cell strings 90b arranged side by side. Each memory string 90a includes a semiconductor pillar 30a, a semiconductor pillar 30b, and a connection portion 60a. Each memory string 90b includes a semiconductor pillar 30c, a semiconductor pillar 30d, and a connection portion 60b. The memory strings 90a, 90b are also referred to as NAND strings.

In the following description, the direction vertical to an upper surface 11a of the substrate 11, for example, in a plane parallel to the back gate layer 15 and underlying layer 10 is referred to as a direction Z (a third direction), and the direction parallel to the memory string 90a and 90b are referred to as a direction X (a first direction). The direction vertical to the memory strings 90a, 90b is referred to as a direction Y (a second direction). In some cases, the direction Z is represented by "upward", and the direction opposite to the direction Z is represented by "downward".

The memory cell array 1 includes a plurality of stacks 20. The plurality of stacks 20 is arranged side by side in the direction X (the first direction). Each stack 20 extends in the direction Y (the second direction). In other words, a plurality of conductors 21 (first conductive layers) included in each stack 20 are provided in stripes extending in the direction Y (the second direction). The conductors 21 are stacked in the direction Z. The conductors 21 function as word lines and control gates and are referred to as conductors (word line) 21 hereinafter. Conductors 27 (second conductive layers) are provided on the respective stacks 20 arranged side by side in the direction X and extend in the direction Y. The conductors 27 function as selection gates and selection gate lines and are referred to as the conductors (selection gate) 27 hereinafter.

The semiconductor pillars 30a, 30b, 30c, 30d penetrate the stacks 20 and conductors (selection gate) 27 in the direction Z. Upper end portions of the semiconductor pillars 30a, 30d are connected to bit lines 51 via contact plugs 55. Upper end portions of the semiconductor pillars 30b, 30c are connected to a source line 53 via contact plugs 55. The connection portions 60a, 60b are provided in the surface of the back gate layer 15. One end of the connection portion 60a is connected to the lower end portion of the semiconductor pillar 30a, and the other end of the connection portion 60a is connected to the lower end portion of the semiconductor pillar 30b. One end of the connection portion 60b is connected to the lower end portion of the semiconductor pillar 30c, and the other end of the connection portion 60b is connected to the lower end portion of the semiconductor pillar 30d.

The plurality of memory strings 90a, 90b is arranged in parallel in the direction Y (the second direction) in FIG. 1 in a plane parallel to the back gate layer 15.

The substrate 11 is a silicon substrate, for example. On the upper surface 11a of the substrate 11, a circuit controlling the memory cell array 1 is provided. The memory cell array 1 is provided on the interlayer insulating layer 13.

The memory cell array 1 includes the back gate layer 15 provided on the interlayer insulating layer 13 and the stacks 20 provided on the back gate layer 15. Each stack 20 includes the plurality of conductors (word line) 21. The memory cell array 1 further includes the conductors (selection gate) 27 provided on the respective stacks 20 and a wiring layer 50 provided above the conductors (selection gate) 27. The wiring layer 50 includes the bit lines 51, source lines 53, and the contact plugs 55.

Figure 2:
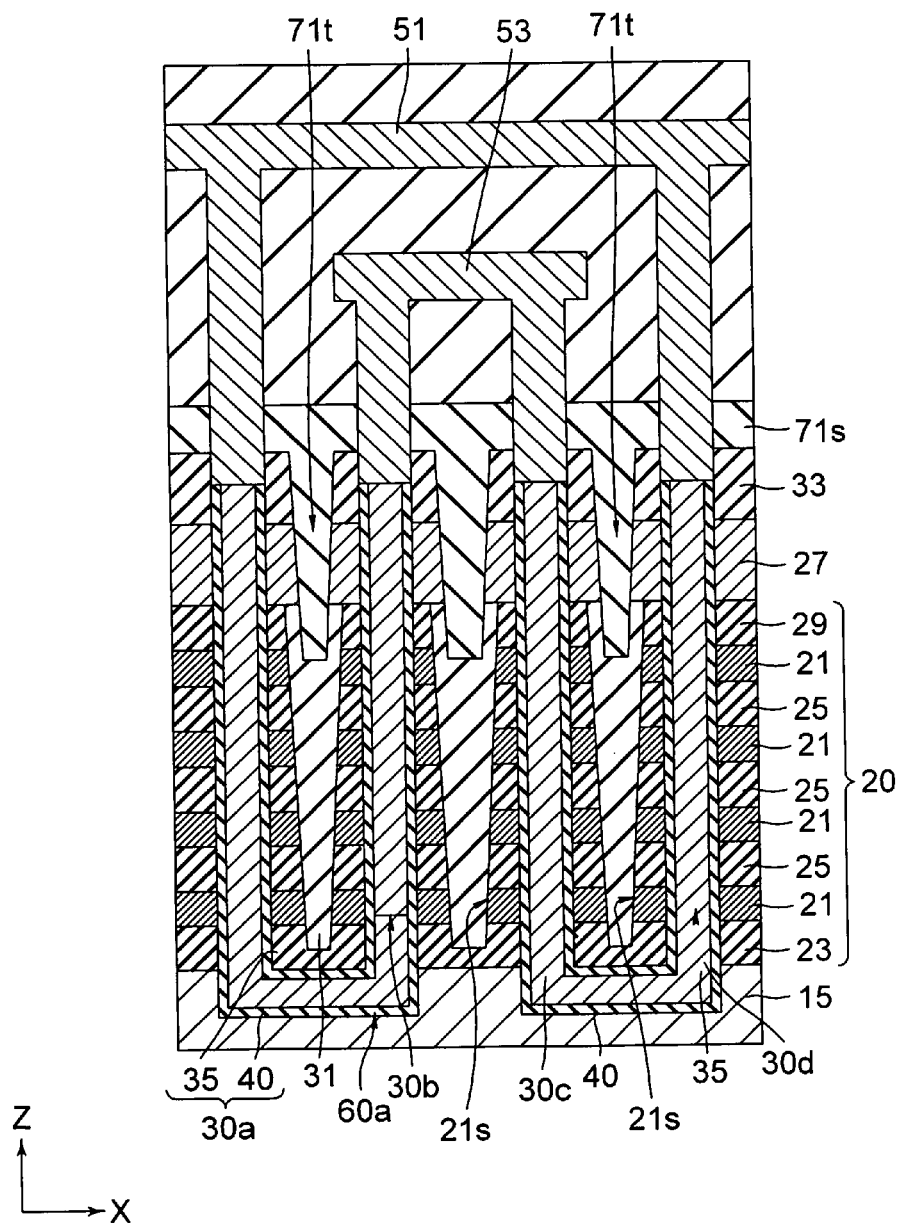
FIG. 2 is a cross-sectional view illustrating the nonvolatile semiconductor memory device according to the first embodiment.

FIG. 2 is a cross-sectional view illustrating the nonvolatile semiconductor memory device 100 according to the first embodiment. The structure of the nonvolatile semiconductor memory device 100 will be described in detail with reference to FIGS. 1 and 2 hereinafter.

Each of the set of the semiconductor pillars 30a, 30b and the connection portion 60a and the set of the semiconductor pillars 30c, 30d and the connection portion 60b is provided with a memory layer 40 in the outer portion and a semiconductor layer 35 in the inner portion. The portions of the memory layers 40 provided between the conductors (word line) 21 and each of the semiconductor pillars 30a to 30d function as charge storage film. Memory cells MC are formed between each conductor (word line) 21 and the semiconductor pillars 30a to 30d. Selection transistors are formed between each conductor (selection gate) 27 and the semiconductor pillars 30a to 30d. The portions of the memory layers 40 provided between each conductor (selection gate) 27 and the semiconductor pillars 30a to 30d function as gate insulating film for the selection transistors. The portions of the memory layers 40 provided for the connection portions 60a, 60b function as gate insulating film for back gate transistors.

As illustrated in FIG. 2, the nonvolatile semiconductor memory device 100 includes the back gate layer 15 and the plurality of stacks 20 formed on the back gate layer 15.

In each stack 20, the insulating film 23, conductor (word line) 21, insulating film 25, conductor (word line) 21, insulating film 25, conductor (word line) 21, insulating film 25, conductor (word line) 21, and an insulating layer 29 are stacked in the direction Z, for example. Each conductor 21 (word line) is composed of a polycrystalline silicon film, and each insulating film 25 is composed of a silicon oxide film ($SiO_2$), for example.

The conductors (selection gate) 27 are provided on the insulating layers 29 of the stacks 20. An insulating layer 33 and an insulating layer 71s are provided on the conductors (selection gate) 27. The insulating layer 71s is provided on the insulating layer 33 and is extended in the direction X over the plurality of selection gates. The insulating layer 71s includes extension portions 71t extending between the pairs of conductors (selection gate) 27 adjacent to each other.

The insulating layer 71s and insulating layer 31 also provided are on the left side of the semiconductor pillar 30a of the memory string 90a and on the right side of the semiconductor pillar 30d of the memory string 90b, although not illustrated in FIG. 2.

Between the stacks 20 adjacent to each other in the direction X, the insulating layer 31 is provided in each trench extending from the insulating layer 29 of the stacks 20 to the conductors (word line) 21 at the lowest layer of each stack 20. End portions 21s of the conductors (word line) 21 which are in contact with the insulating layer 31 are silicidized.

Each of the semiconductor pillars 30a to 30d includes a part of the semiconductor layer 35 extending in the direction Z at the center and a part of the memory layer 40 covering the semiconductor layer 35. The memory layer 40 is provided between the corresponding stack 20 and semiconductor layer 35.

The memory layer 40 has a structure in which a silicon oxide film ($SiO_2$ film), a silicon nitride film ($Si_3N_4$ film), and a silicon dioxide ($SiO_2$ film) are sequentially layered in the direction from the stack 20 toward the semiconductor layer 35. The outer portion of the memory layer 40 is in contact with the stack 20, and the inner portion of the memory layer 40 is in contact with the semiconductor layer 35. The memory layer 40 includes charge storage portions in the silicon nitride film or between the silicon nitride film and silicon oxide films, for example.

The connection portion 60a includes a part of the semiconductor layer 35 electrically connecting the semiconductor pillar 30a and semiconductor pillar 30b and a part of the memory layer 40 provided between the back gate layer 15 and the part of the semiconductor layer 35. In a similar manner, the connection portion 60b includes a part of the semiconductor layer 35 electrically connecting the semiconductor pillar 30c and semiconductor pillar 30d and a part of the memory layer 40 provided between the back gate layer 15 and the part of the semiconductor layer 35. In other words, the memory layer 40 is also provided between the part of the semiconductor layer 35 and back gate layer 15.

Figure 3:
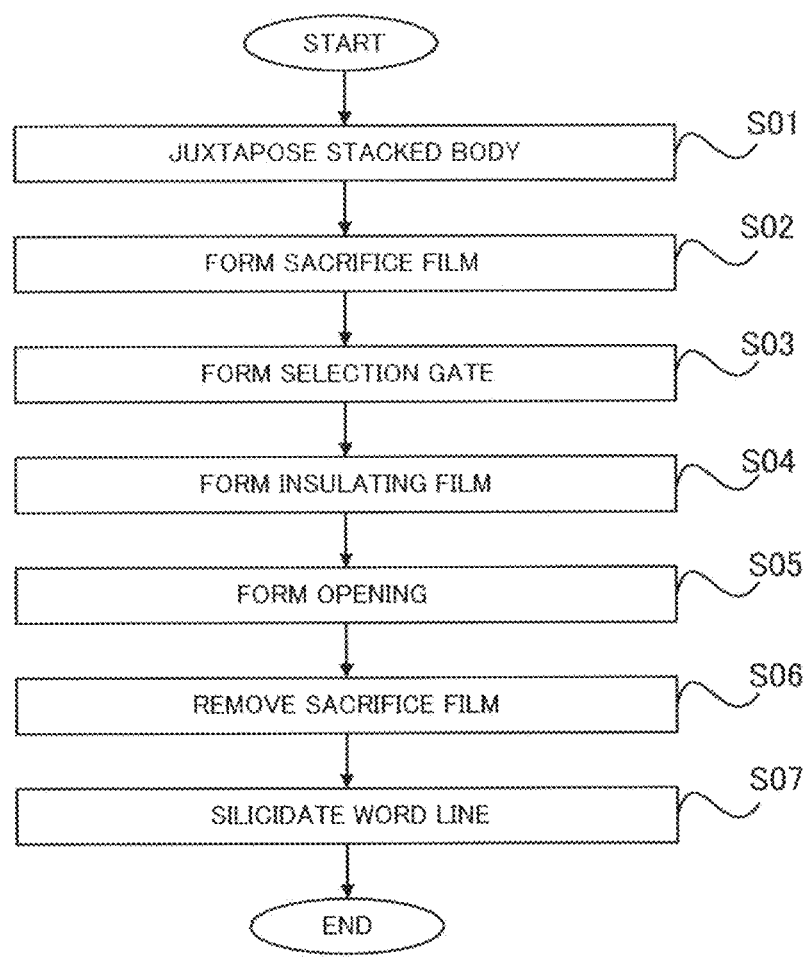
FIG. 3 is a flow chart showing a method of fabricating the nonvolatile semiconductor memory device according to the first embodiment.

FIG. 3 is a flow chart showing a method of fabricating the nonvolatile semiconductor memory device 100 according to the first embodiment.

The fabrication method according to the embodiment includes: a step of forming a plurality of stacks 20 which is arranged side by side in the direction X and are extended in the direction Y in a plane parallel to the back gate layer 15 and underlying layer 10 (step S01); a step of forming a sacrificial layer 63 between pairs of the plurality of stacks 20 adjacent to each other (step S02); a step of forming the conductors (selection gate) 27 on the plurality of stacks 20 (step S03); a step of forming the insulating layer 71 covering the conductors (selection gate) 27 and sacrificial layer 63 (step S04); a step of selectively etching the insulating layer 71 to form trenches 73 communicating with the sacrificial layer 63 (step S05); a step of selectively removing the sacrificial layer 63 through the trenches 73 (step S06); and a step of silicidizing the plurality of conductors (word line) 21 exposed in the side surfaces of each stack 20 (step S07).

The insulating layer 71 is divided into the plurality of insulating layers 71s (beam portions) each extending over two selection gates provided on the pairs of stacks 20 adjacent to each other. Each insulating layer 71s allows the adjacent stacks 20 to support each other after the sacrificial layer 63 is removed. Such a structure can prevent the stacks 20 from collapsing. The insulating layer 71s is also referred to an insulating layer stripe pattern.

Next, the method of fabricating the nonvolatile semiconductor memory device 100 according to the first embodiment will be described in detail with reference to FIGS. 4A to 10C. FIGS. 4A to 10C are views illustrating a fabrication process of the nonvolatile semiconductor memory device 100 according to the first embodiment.

Figure 4A:
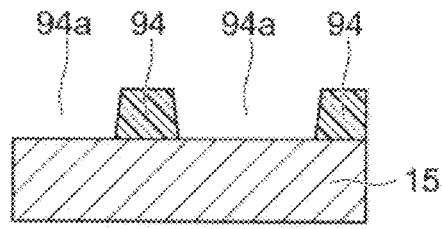
FIGS. 4A to 4E are cross-sectional views illustrating a fabrication process of the nonvolatile semiconductor memory device according to the first embodiment.

As illustrated in FIG. 4A, resist 94 is formed on the back gate layer 15. The back gate layer 15 is a P-type polycrystalline silicon layer doped with impurities such as boron, for example. The resist 94 includes trenches 94a selectively formed by patterning.

Figure 4B:
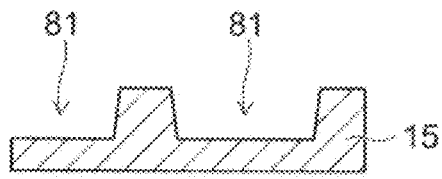

Next, the resist 94 is used as a mask to selectively dry etch the back gate layer 15. As illustrated in FIG. 4B, recessed portions 81 are formed in the upper portion of the back gate layer 15.

Figure 4C:
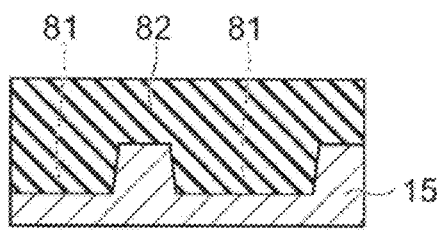
Figure 4D:
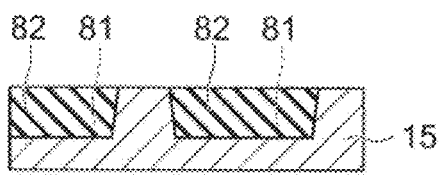

Subsequently, as illustrated in FIG. 4C, the recessed portions 81 are filled with a sacrificial layer 82. The sacrificial layer 82 is a silicon nitride film ($Si_3N_4$ film), a non-doped polycrystalline silicon film, or the like, for example. The sacrificial layer 82 is etched back all over the surface to expose the back gate layer 15 around each recessed portion 81 and flatten the surfaces of the sacrificial layer 82 and back gate layer 15 as illustrated in FIG. 4D.

Figure 4E:
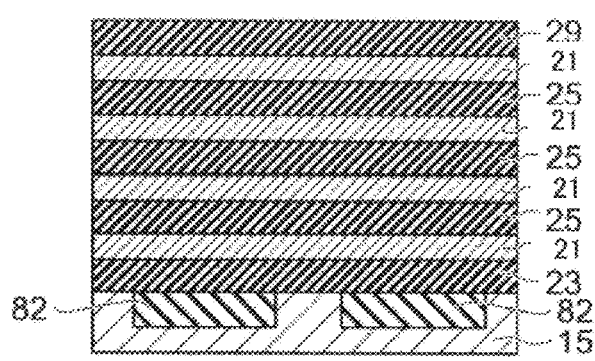

Next, as illustrated in FIG. 4E, an insulating layer 23 is formed on the back gate layer 15. The conductors (conductors (word line)) 21 as conductive layers and insulating layers 25 are alternately stacked on one another on the insulating layer 23. The insulating layer 29 is formed on the conductors (word line) 21 at the top layer.

Figure 5A:
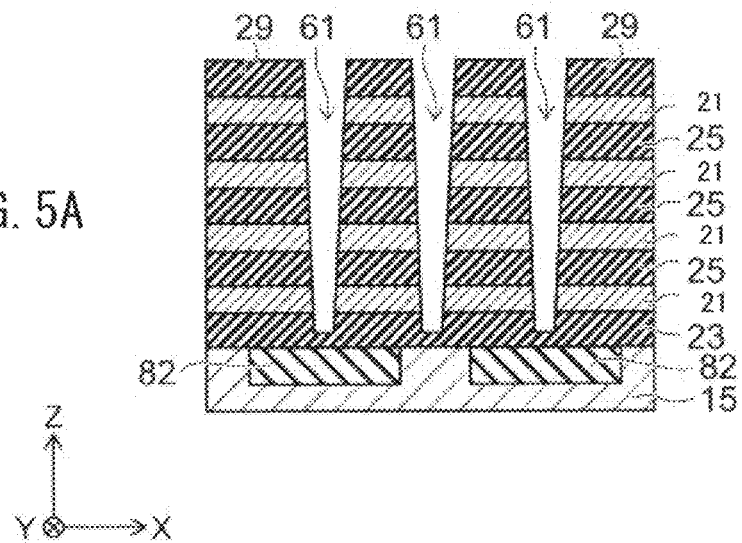
FIGS. 5A and 5B are cross-sectional views illustrating the fabrication process of the nonvolatile semiconductor memory device according to the first embodiment.

Next, as illustrated in FIG. 5A, the plurality of trenches 61 is formed so as to divide the conductors (word line) 21 as a plurality of conductive layers and the insulating layers 25 and reach the insulating layer 23. The trenches 61 individually extend in the direction Y. The conductors (word line) 21 as the conductive layers are therefore separated, so that the plurality of stacks 20 arranged in the direction X is formed.

The trenches 61 are formed by using RIE (reactive ion etching), for example. Specifically, an etching mask (not shown) is formed on the insulating layer 29, and the insulating layer 29, conductors (word line) 21 as the conductive layers, and insulating layers 25 are selectively dry-etched.

The insulating layer 23 is made of a material which cannot be etched under the same etching conditions as the etching conditions for the conductors (word line) 21 as the conductive layers, insulating layers 25, and insulating layer 29 or a material having an etching rate lower than the etching rates of the conductors (word line) 21 as the conductive layers, insulating layers 25, and insulating layer 29. The insulating layer 23 is a tantalum oxide film (TaO$_x$ film) or aluminum oxide film (Al$_2$O$_3$ film), for example. The insulating layer 23 therefore functions as an etching stop layer and prevents the trenches 61 from reaching the back gate layer 15.

Next, the sacrificial layer 63 filling the insides of the trenches 61 is formed. The sacrificial layer 63 covering all of the plurality of stacks 20 is formed, for example. Thereafter, the sacrificial layer 63 is etched back all over the surface so as to partially remain in the trenches 61.

Figure 5B:
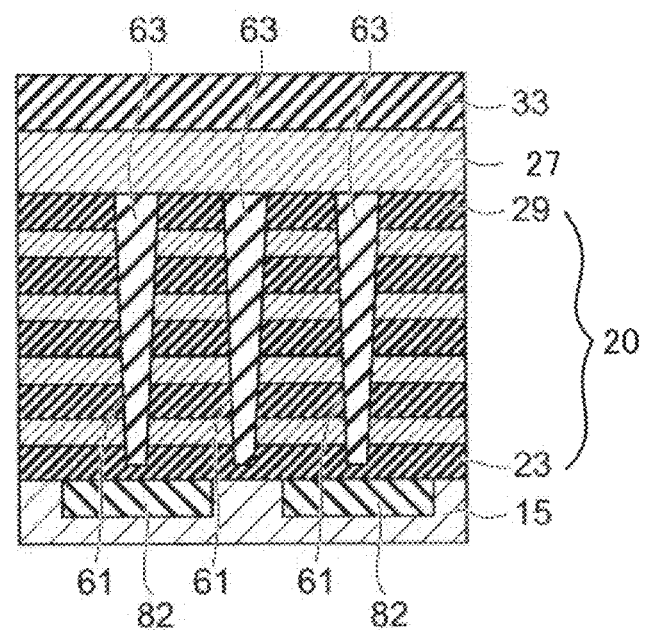

Subsequently, as illustrated in FIG. 5B, the conductors (selection gate) 27 made of a conductor film and insulating layer 33 are stacked on the insulating layer 29 and sacrificial layer 63. The sacrificial layer 63 is composed of a silicon nitride film (Si$_3$N$_4$ film) or a non-doped polycrystalline silicon film.

Figure 6A:
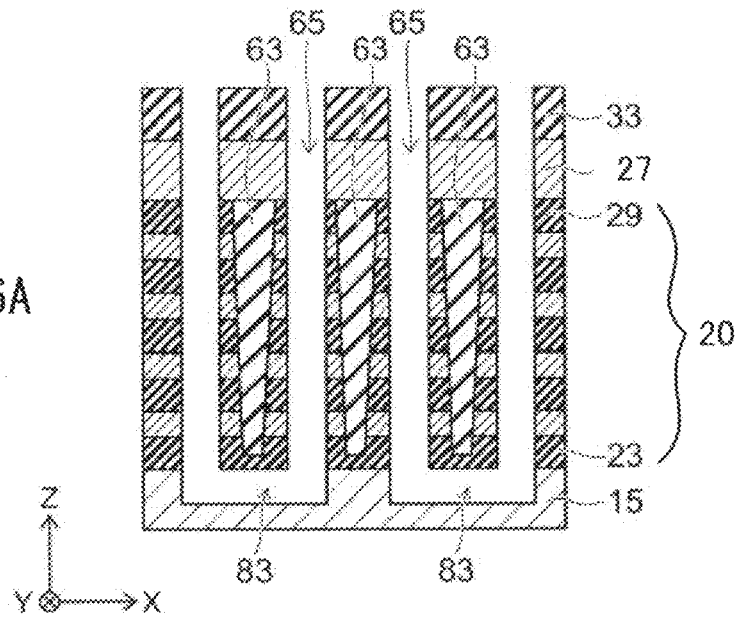
FIGS. 6A and 6B are cross-sectional views illustrating the fabrication process of the nonvolatile semiconductor memory device according to the first embodiment.

As illustrated in FIG. 6A, memory holes (trenches) 65 and connection holes 83 are then formed. The memory holes 65 penetrate the conductors (selection gate) 27 made of a conductor film, stacks 20, and insulating layer 23 from the upper surface of the insulating layer 33 to the back gate layer 15. Each of the connection holes 83 connects the adjacent memory holes 65 within the back gate layer 15.

The connection holes 83 are formed by selectively etching the sacrificial layer 82 through the memory holes 65 to reproduce the recessed portions 81. The memory holes 65 are formed so as to communicate with the sacrificial layer 82 buried in the back gate layer 15. The sacrificial layer 82 is etched by etching liquid supplied through the memory holes 65.

When the sacrificial layer 82 is a non-doped polycrystalline silicon film, for example, the sacrificial layer 82 can be removed by wet etching using an alkaline chemical such as potassium hydroxide (KOH) solution. Alternatively, when the sacrificial layer 82 is a silicon nitride film, for example, the sacrificial layer 82 can be removed by wet etching using phosphoric acid (H$_3$PO$_4$) solution.

Figure 6B:
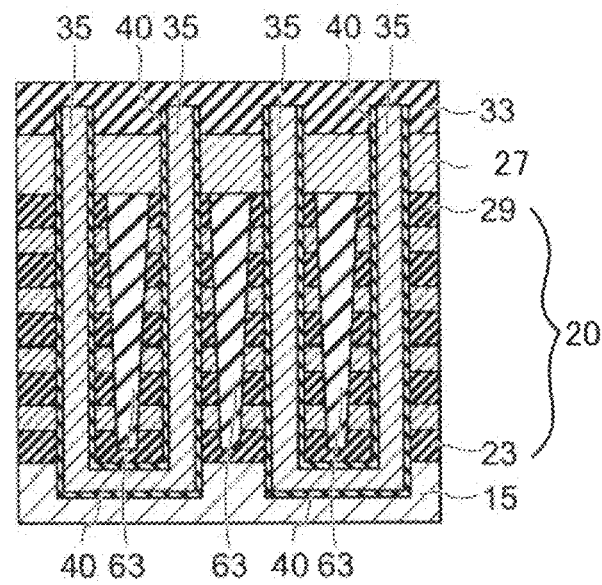

Next, as illustrated in FIG. 6B, the memory layers 40 are formed on the inner walls of the memory holes 65 and the inner surfaces of the connection holes 83, and then the semiconductor layers 35 are formed on the respective memory layers 40.

Each memory layer 40 includes, for example, a silicon oxide film formed on the inner wall of the corresponding memory hole 65 and the inner surface of the corresponding connection hole 83, a silicon nitride film formed on the silicon oxide film, and a silicon oxide film formed on the silicon nitride film.

Each semiconductor layer 35 is a polycrystalline silicon layer and is formed on the memory layer 40, for example. The semiconductor layer 35 may be configured to completely fill the insides of the memory holes 65 and the inside of the connection hole 83 or may be configured to have a hollow structure with a void left at the center. Moreover, it is possible to form a core insulating film as an insulating layer in the hollow portion.

The memory layer 40 and semiconductor layer 35 are sequentially stacked on the inner walls of the memory holes 65, the inner surface of the connection hole 83, and the insulating layer 33 by using CVD (chemical vapor deposition), for example. Subsequently, the semiconductor layer 35 and memory layer 40 are sequentially etched back so as to remove the portions formed on the insulating layer 33. The semiconductor pillars 30$a$ to 30$d$ are thus formed within the respective memory holes 65, and the connection portions 60$a$, 60$b$ are formed within the connection holes 83.

Another insulating layer is formed on the insulating layer 33 in which the end portions of the semiconductor pillars 30$a$ to 30$d$ are exposed. Herein, as illustrated in FIG. 6B, an insulating layer including the same material as that of the insulating layer 33 is formed, so that the integrated insulating layer 33 covers the end portions of the semiconductor pillars 30$a$ to 30$b$.

Figure 7A:
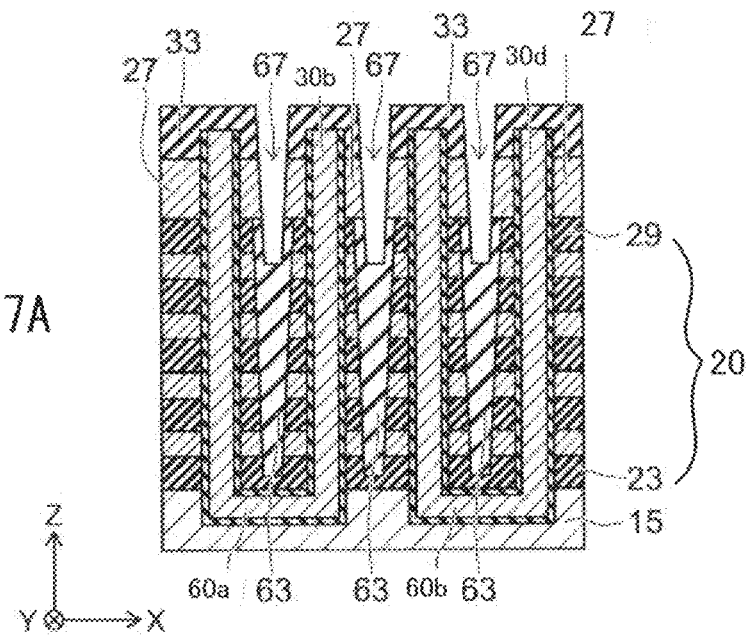
FIGS. 7A and 7B are cross-sectional views illustrating the fabrication process of the nonvolatile semiconductor memory device according to the first embodiment.

Next, as illustrated in FIG. 7A, the trenches 67 penetrating from the upper surface of the insulating layer 33 to the surfaces of the sacrificial layer 63 are formed. The trenches 67 extend in the direction Y and divide the conductor 27 into the conductors (selection gate) 27. Specifically, the conductors (selection gate) 27 are formed in stripes extending in the direction Y and are provided on the respective stacks 20 arranged in the direction X.

Figure 7B:
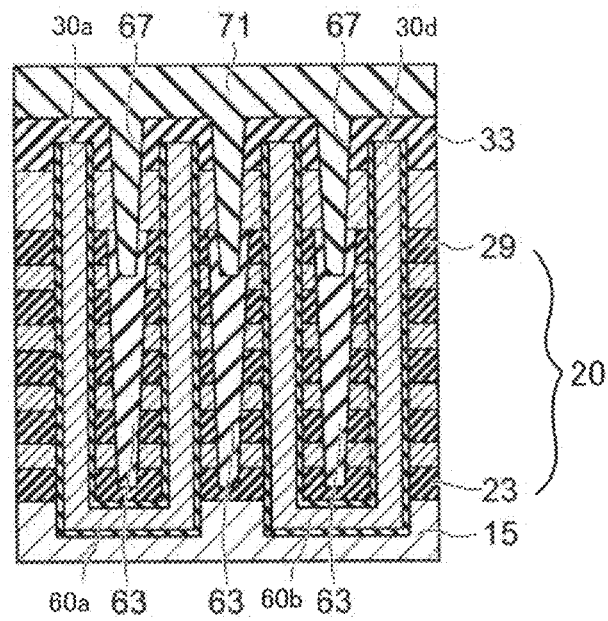

Subsequently, as illustrated in FIG. 7B, the insulating layer 71 is formed on the insulating layer 33. The insulating layer 71 fills the inside of each trench 67 and covers the insulating layer 33.

Figures 8A, 8B, 8C:
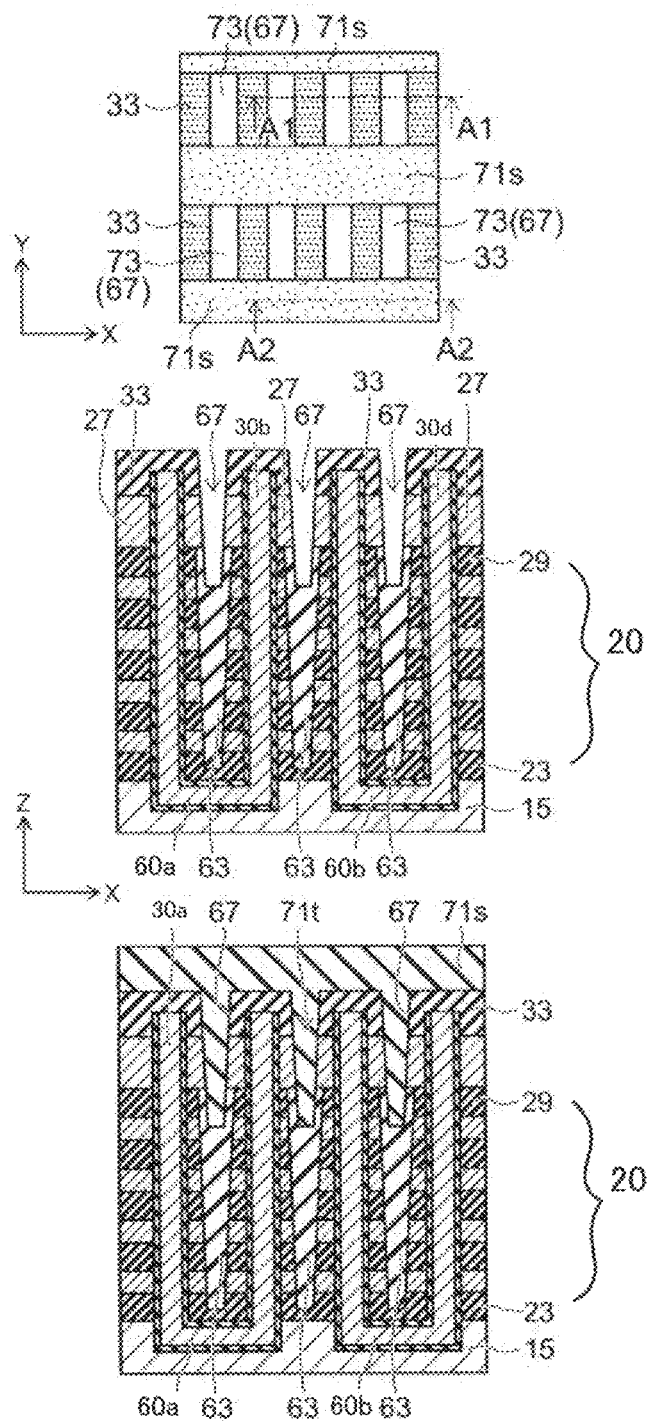
FIGS. 8A to 8C are views illustrating a the fabrication process of the nonvolatile semiconductor memory device according to the first embodiment.

FIGS. 8A to 8C are views illustrating the insulating layers 71 etched into stripes. FIG. 8A is a top view, and FIG. 8B is a cross-sectional view taken along a line A1-A1 shown in FIG. 8A. FIG. 8C is a cross-sectional view taken along a line A2-A2 shown in FIG. 8A.

As illustrated in FIG. 8A, the insulating layer 71 is selectively etched to form the plurality of insulating layers 71$s$. Specifically, the portion of the insulating layer 71 in a first region indicated by a line A2-A2 in FIG. 8A is left to form the insulating layer 71$s$, and the part of the insulating layer 71 in a second region indicated by a line A1-A1 in FIG. 8A is removed. Accordingly, the insulating layer 33 is partially exposed between the insulating layer 71$s$ adjacent in the direction Y, and a plurality of trenches 73 is formed. Preferably, the insulating layer 71 is made of a material having an etching rate very much smaller than the etching rates of the insulating layer 33, conductors (word line) 21, conductors (selection gate) 27, sacrificial layer 63, and the like, for example.

As illustrated in FIG. 8B, each trench 73 is a part of the corresponding trench 67 and communicates with the sacrificial layer 63. As illustrated in FIG. 8C, each of the insulating layers 71$s$ formed in stripes includes extension portions 71$t$ extending into the respective trenches 67 and covers the end faces of the conductors (selection gate) 27.

Figure 9A:
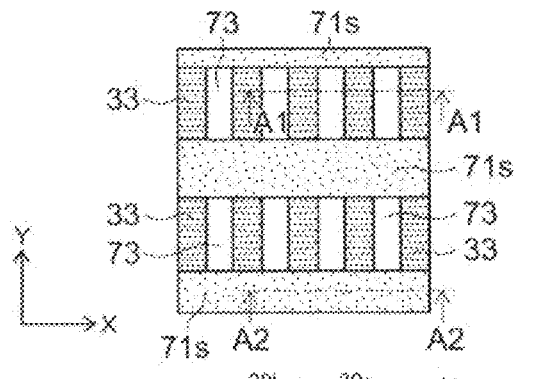
FIGS. 9A to 9C are views illustrating a the fabrication process of the nonvolatile semiconductor memory device according to the first embodiment.
Figure 9B:
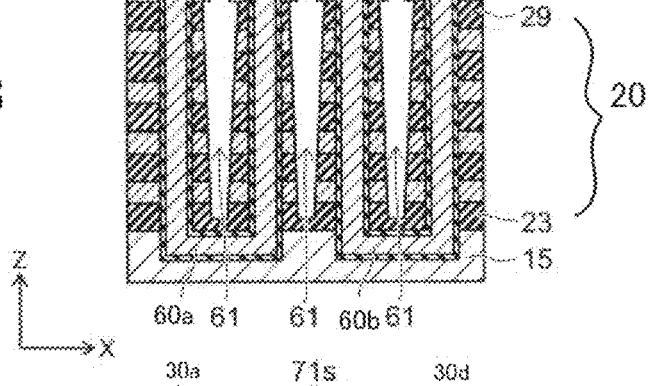
Figure 9C:
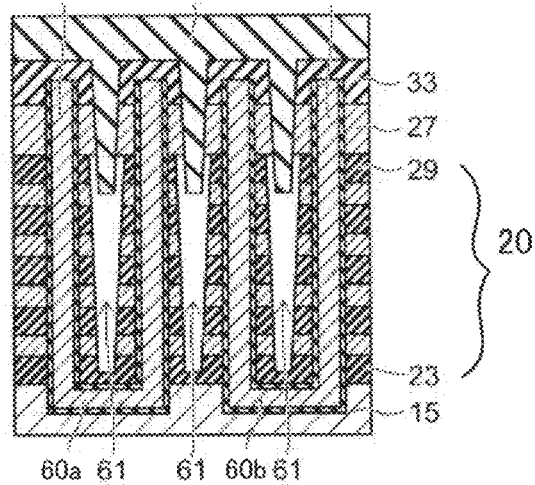

FIGS. 9A to 9C are views illustrating a state where the sacrificial layer 63 is selectively removed to reproduce the trenches 61. FIG. 9A is a top view, and FIG. 9B is a cross-sectional view taken along a line A1-A1 shown in FIG. 9A. FIG. 9C is a cross-sectional view taken along a line A2-A2 shown in FIG. 9A.

As illustrated in FIG. 9B, the sacrificial layer 63 is selectively removed with etching liquid supplied through the trenches 73. As illustrated in FIG. 9C, the portion of each insulating layer 71$s$ laid over each pair of adjacent conductors (selection gate) 27 is left between the conductors (selection gate) 27, and voids are reproduced as the trenches 61 under the insulating layer 71$s$.

For example, in the case where the sacrificial layer 63 is composed of a silicon nitride film (Si3N4 film), the insulating layer 71$s$ is composed of a silicon dioxide film (SiO2 film), the insulating layer 33 is composed of a tantalum oxide film (TaOx film) or a stacked film which is stacked a tantalum oxide film (TaOx film) on a silicon dioxide film (SiO2 film). In the above case, the insulating layer 33 and insulating layers 71$s$ are resistant to wet etching using phosphoric acid (H3PO4) solution. The sacrificial layer 63 can be therefore selectively removed.

Moreover, for example, in the case where the sacrificial layer 63 is composed of a non-doped polycrystalline silicon film., the insulating layer 71s is composed of a silicon nitride film (Si3N4 film), the insulating layer 33 is composed of a silicon dioxide film (SiO2 film).In this case, the insulating layer 33 and insulating layers 71s are resistant to wet etching using an alkaline chemical such as potassium hydroxide (KOH) solution. The sacrificial layer 63 can be therefore selectively removed.

Figure 10A:
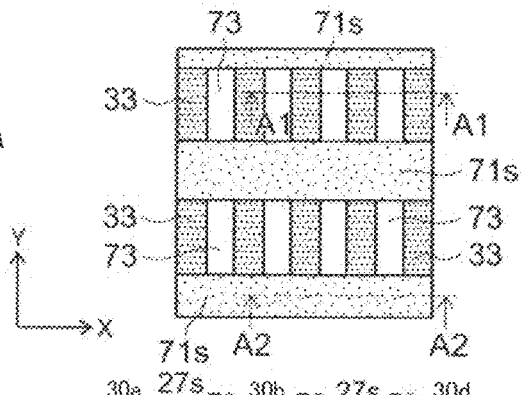
FIGS. 10A to 10C are views illustrating the fabrication process of the nonvolatile semiconductor memory device according to the first embodiment.
Figure 10B:
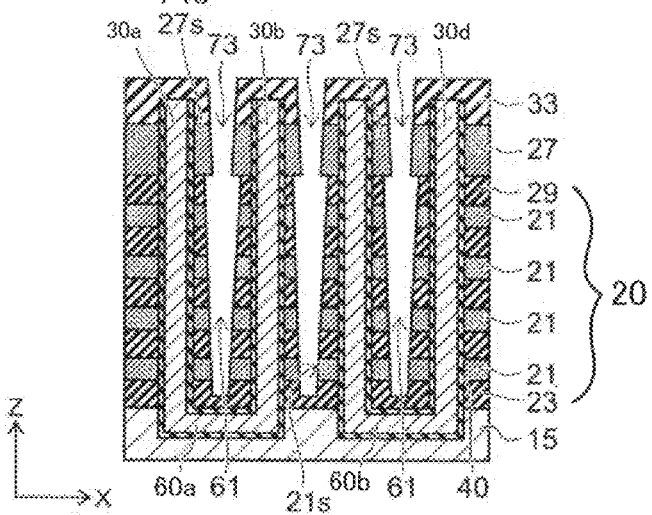
Figure 10C:
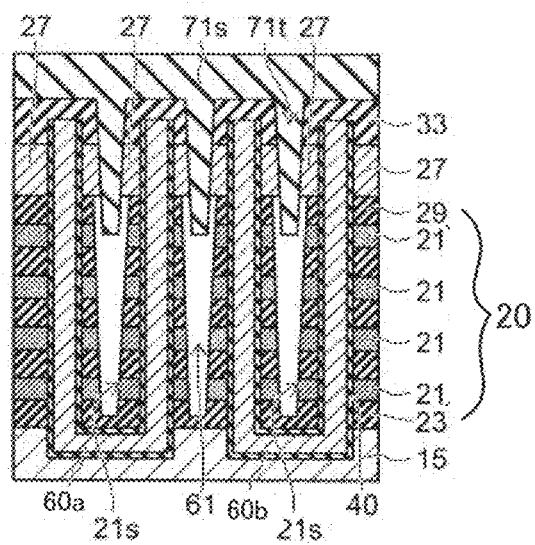

FIGS. 10A to 10C are views illustrating the silicidized conductors (word line) 21 and conductors (selection gate) 27. FIG. 10A is a top view, and FIG. 10B is a cross-sectional view taken along a line A1-A1 shown in FIG. 10A. FIG. 10C is a cross-sectional view taken along a line A2-A2 shown in FIG. 10A.

A CVD method is used, for example, to form a nickel (Ni) film on the inner surface of each of the trenches 73, 61. After the nickel films are formed, heat treatment is performed to silicidize the conductors (word line) 21 and conductors (selection gate) 27. As a result, nickel silicide is formed at least the end portions 21s of the conductors (word line) 21 and the end portions 27s of the conductors (selection gate) 27. Such silicidization may be performed for not only the end portions but also the entire conductors (word line) 21 and conductors (selection gate) 27. On the other hand, nickel attached to the end portions of the insulating layers remains metallic nickel. Accordingly, nickel attached to the end faces of the insulating layers can be removed by wet etching, for example.

The aforementioned silicidization employs nickel (Ni) but may employ cobalt (Co), titanium (Ti), Tantalum (Ta), tungsten (W), or the like.

As illustrated in FIG. 10B, the end portions 21s of the conductors (word line) 21 exposed in the inner wall of each trench 61 (the side surface of the stacks 20) and the end portions 27s of the conductors (selection gate) 27 exposed in the inner wall of each trench 73 are silicidized. On the other hand, in the portion under each insulating layer 71s, the end portions of the conductors (selection gate) 27 are covered with the extension portions 71t of the insulating layer 71s and cannot be silicidized as illustrated in FIG. 10C.

Figure 21A:
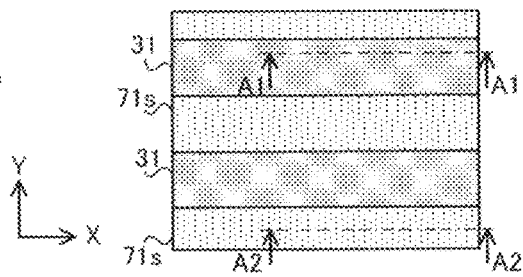
FIGS. 21A to 21C are views illustrating the fabrication process of the nonvolatile semiconductor memory device according to the first embodiment.
Figure 21B:
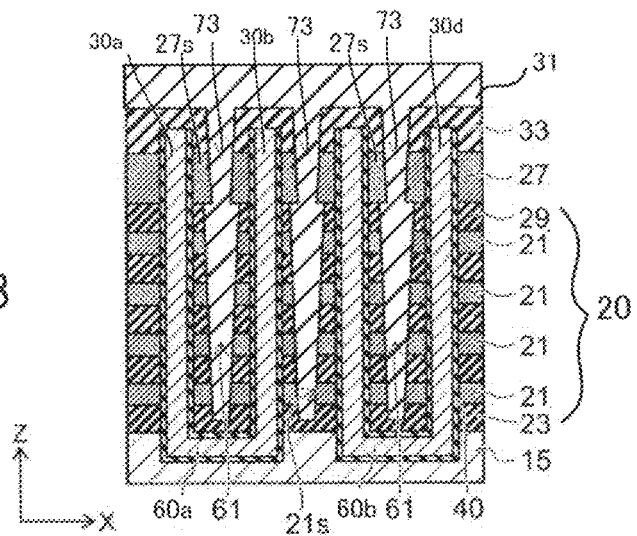
Figure 21C:
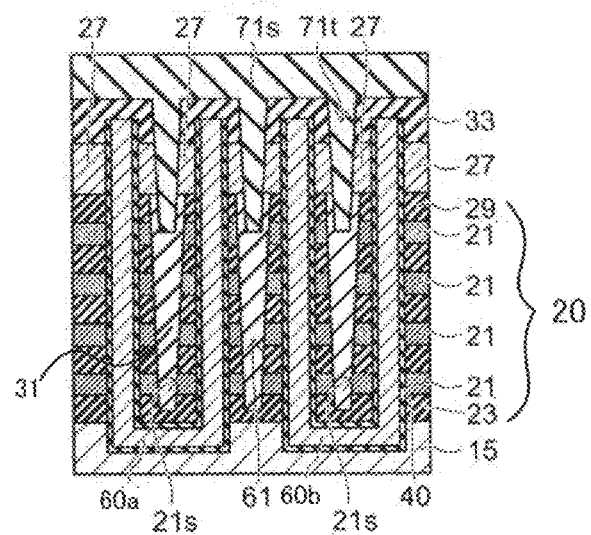

After the silicidization, the insulating layer 31 filling the trenches 61, 73 is formed. FIGS. 21A to 21C are views illustrating the silicidized conductors (word line) 21 and conductors (selection gate) 27 after the insulating layer 31 is buried. FIG. 21A is a top view, and FIG. 21B is a cross-sectional view taken along a line A1-A1 shown in FIG. 21A. FIG. 21C is a cross-sectional view taken along a line A2-A2 shown in FIG. 21A.

The trenches 61 in the first region indicated by a line A2-A2 of FIG. 21A are filled with the insulating layer 31, and the trenches 73 in the first region indicated by a line A2-A2 of FIG. 21A are filled with the insulating layer 71s. The trenches 61, 73 in the second region indicated by an A1-A1 line of FIG. 21A are filled with the insulating film 31.

Subsequently, the contact plugs 55 which are connected to the end portions of the semiconductor pillars 30a to 30d are formed. The wiring layer 50 including the bit lines 51 and source lines 53 is then formed, thus completing the memory cell array 1.

Figure 22:
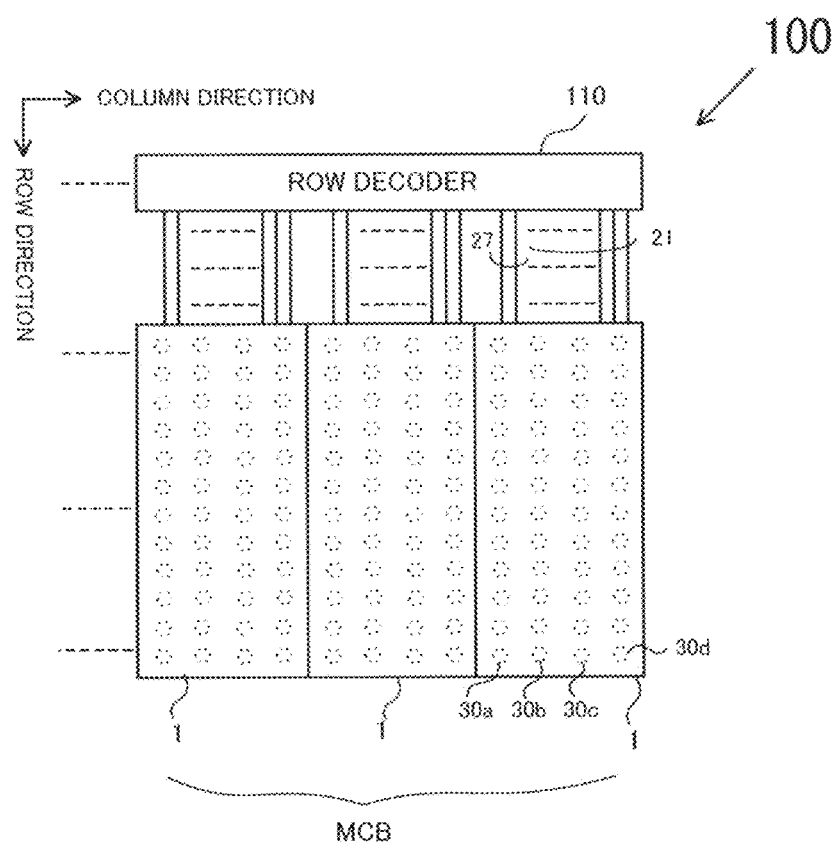
FIG. 22 is a top view illustrating the nonvolatile semiconductor memory device according to the first embodiment.

FIG. 22 is a top view illustrating the nonvolatile semiconductor memory device 100 after the fabrication process is completed. The conductors (word line) 21 are silicidized within the memory cell block MCB including a plurality of memory cell arrays 1 as illustrated in FIG. 22. The conductors (word line) 21 led out from the memory cell block MCB and connected to a raw decoder 110 are not silicidized. The conductors (selection gate) 27 led out from the memory cell block MCB and connected to the raw decoder 110 are not silicidized.

In the first embodiment, the insulating layer 71s formed over the plurality of conductors (selection gates) 27 function as supports between adjacent stacks 20 and prevent the stacks 20 from collapsing in the process of silicidizing the conductors (word line) 21, for example. This can increase the manufacturing yield of the nonvolatile semiconductor memory device 100.

In the case where such collapse of the stacks 20 can be prevented by the insulating layers 71s, the aspect ratio of the stacks 20 (height in the direction Z/width in the direction X) can be increased. For example, it is possible to form the trenches 61 between the semiconductor pillars 30a to 30d arranged side by side in the direction X for silicidizing the conductors (word line) 21. This can considerably reduce the electric resistance of the conductors (word line) 21. The first embodiment is not limited to the above-described example. The width of each stack 20 in the direction X may be doubled by forming the trenches 61 between every second semiconductor pillar arranged in the direction X.

Figure 11A:
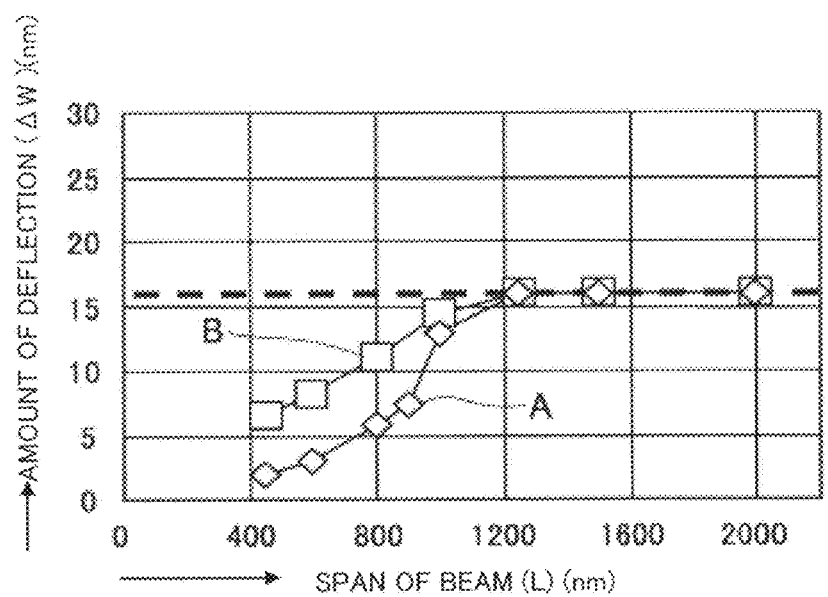
FIGS. 11A and 11B are diagrams showing the characteristic of the nonvolatile semiconductor memory device according to the first embodiment.
Figure 11B:
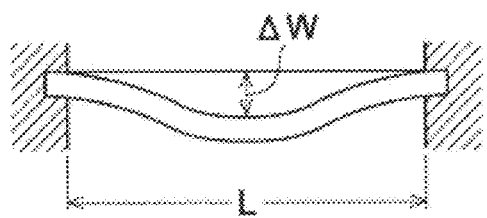

Next, the conditions to determine the distance between adjacent beam portions (insulating layer 71s), that is, the width of the trenches 73 in the direction Y will be described with reference to FIGS. 11A and 11B. FIGS. 11A and 11B are diagrams showing the characteristics of the nonvolatile semiconductor memory device according to the first embodiment.

FIG. 11A shows a result of simulation of the relationship between the length of each stack 20 and the amount of deflection based on a model in which both ends of the stack 20 in the extending direction are fixed. To be specific, FIG. 11A shows the relationship between a span L of a beam fixed at the both ends and the amount $\Delta W$ of deflection. The horizontal axis indicates the span L, and the vertical axis indicates the amount $\Delta W$ of deflection. FIG. 11B is a cross-sectional view schematically showing deflection caused when uniform force is applied to the beam with both ends fixed. The aspect ratio of each stack 20 is 13.

Solid line A shown in FIG. 11A represents the deflection characteristic when the intervals between adjacent stacks 20 are set to 35 nm. The solid line B shown in FIG. 11A represents the deflection characteristic when the intervals between adjacent stacks 20 are set to 25 nm. External force, such as surface tension applied to between the adjacent stacks 20 at wet etching, for example, depends on the distance between the adjacent stacks 20 and is reduced as the distance increases. The external force applied to the beam in the example of the solid line A is smaller than that of the example of the solid line B, and the amount of deflection thereof is smaller than that of the example of the solid line B.

As shown in FIG. 11A, when the span L exceeds 1200 nanometer (nm), the amounts $\Delta W$ of deflection indicated by the solid lines A and B are constant, which are equal to 16 nm. Accordingly, when the intervals between adjacent stacks 20 are set to 32 nm or more, the adjacent stacks 20 cannot come into contact with each other and will not collapse. In the example represented by the solid line A, therefore, the stacks 20 will not collapse. On the other hand, in the example where the intervals between adjacent stacks 20 are set to 25 nm, the stacks 20 can collapse when the span L is set to 800 nm or more.

The simulation results shown in FIG. 11A are applied to the example shown in FIG. 10A. The span L corresponds to the distance between the insulating layers 71s adjacent to each other in the direction Y (that is, the width of trenches 73 in the direction Y). FIG. 11A suggests the relationship between the width of the trenches 73 and the amount ΔW of deflection of the stacks 20. When the memory cell array 1 is miniaturized by increasing the aspect ratio of the stacks 20 and narrowing the intervals between adjacent stacks 20, the adjacent stacks 20 are more likely to come into contact with each other (collapse) because of the deflection. In order to prevent collapse of the stacks 20, it is preferable that the span L (the distance between adjacent insulating layers 71s) is narrowed. According to the aforementioned results, when the intervals of stacks 20 are set to 25 nm or less, it is desirable that the distance between the insulating layers 71s adjacent to each other, that is, the width of the trenches 73 in the direction Y is set to 800 nm or less.

As described above, the structure illustrated in FIG. 2 is effective on preventing the collapse of the stacks 20 in the process of silicidating the conductors (word line) 21. The insulating layers 25, insulating layer 31, and insulating layers 29 are made of different insulating layers in the description of the above example but may be made of a same material.

The insulating layers 71s and insulating layer 31 can be considered as a single unit when the insulating layers 71s are made of a silicon oxide film. In such a case, it is difficult to distinguish the insulating layers 71s from the other insulating layers. However, the existence of the insulating layers 71s can be estimated based on the fact that the silicidized end portions 27s of the conductors (selection gate) 27 are arranged discontinuously in the direction Y.

Next, a fabrication method according to a first modification will be described with reference to FIGS. 12A to 14C. FIGS. 12A to 14C are cross-sectional views illustrating a fabrication process of the first modification according to the first embodiment.

Figure 12A:
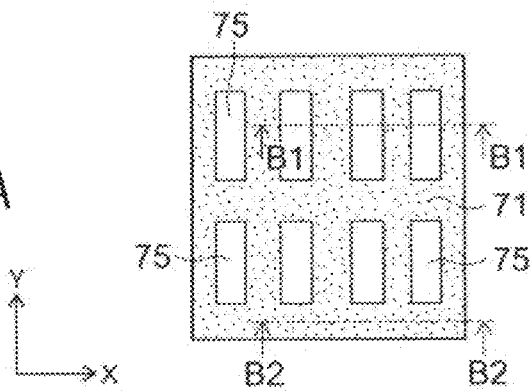
FIGS. 12A to 12C are views illustrating a fabrication process of a nonvolatile semiconductor memory device according to a first modification.
Figure 12B:
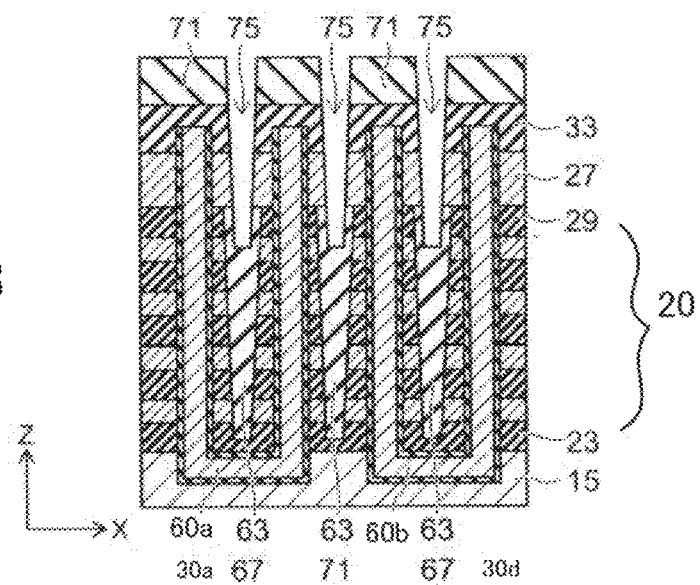
Figure 12C:
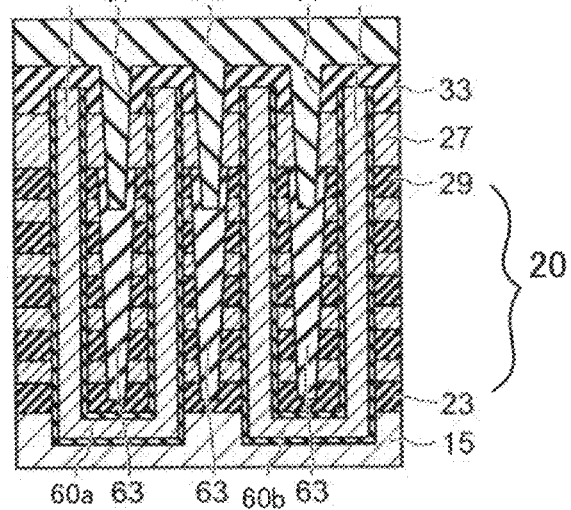

FIGS. 12A to 12C are views illustrating the state where the insulating layer 71 is selectively etched to form a plurality of trenches 75. FIG. 12A is a top view, and FIG. 12B is a cross-sectional view taken along a line B1-B1 shown in FIG. 12A. FIG. 12C is a cross-sectional view taken along a line B2-B2 shown in FIG. 12A.

As illustrated in FIG. 12A, the insulating layer 71 is selectively etched to form the plurality of trenches 75. Specifically, the trenches 75 are formed using anisotropic RIE conditions, for example, from the top surface of the insulating layer 71 so as to communicate with the sacrificial layer 63. In this process, the insulating layer 33 may be made of a same material as that of the insulating layer 71 and can be a silicon oxide film, for example.

As illustrated in FIG. 12B, it is desirable that the trenches 75 communicate with the sacrificial layer 63 and that the conductors (selection gate) 27 are exposed in the side surfaces of the trenches 75. Moreover, as illustrated in FIG. 12C, in the area other than the trenches 75, the insulating layer 71 includes some portions provided on the insulating layer 33 and some portions extended in the trenches 67 (beam portions) and covers the end faces of the conductors (selection gate) 27.

Figure 13A:
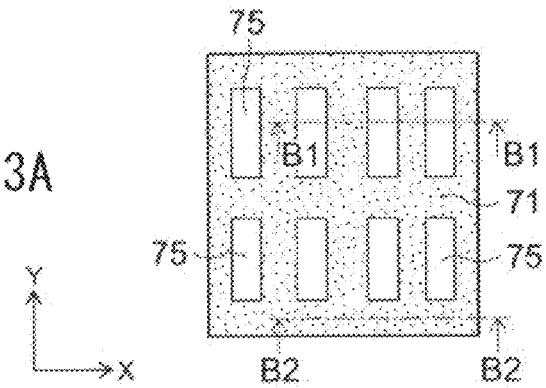
FIGS. 13A to 13C are views illustrating the fabrication process of the nonvolatile semiconductor memory device according to the first modification.
Figure 13B:
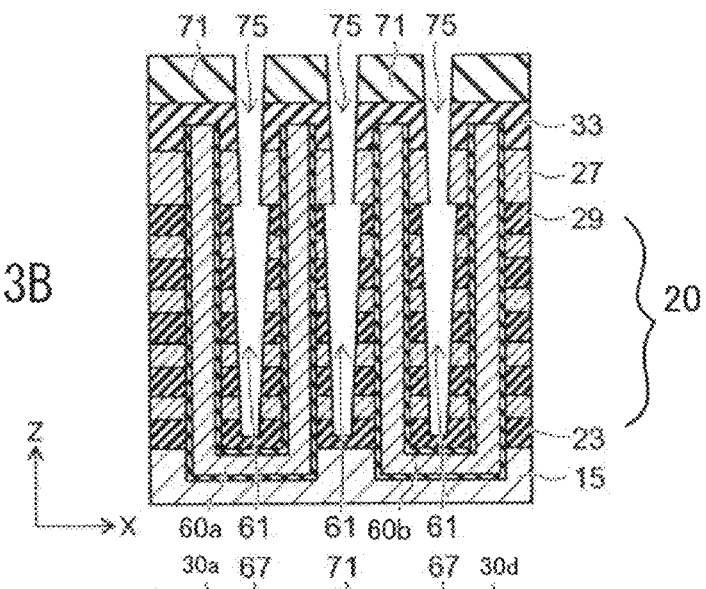
Figure 13C:
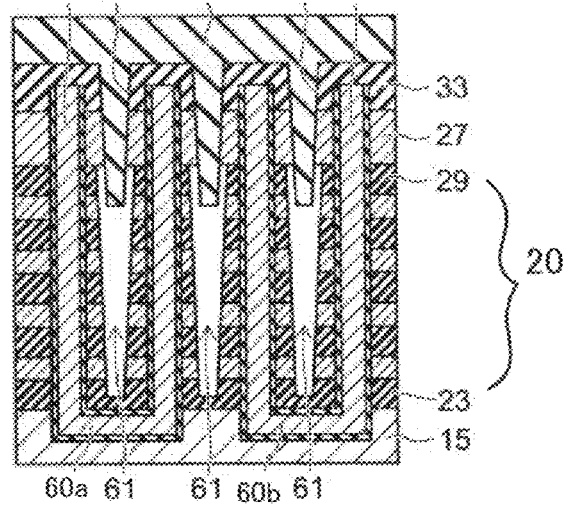

FIGS. 13A to 13C are views illustrating the state where the sacrificial layer 63 is selectively etched to reproduce the trenches 61. FIG. 13A is a top view, and FIG. 13B is a cross-sectional view taken along a line B1-B1 shown in FIG. 13A. FIG. 13C is a cross-sectional view taken along a line B2-B2 shown in FIG. 13A.

As illustrated in FIG. 13B, the sacrificial layer 63 is selectively removed with etching liquid supplied through the trenches 75. As illustrated in FIG. 13C, voids are reproduced as the trenches 61 under the portions of the insulating layer 71 laid over the pairs of adjacent conductors (selection gate) 27.

Figure 14A:
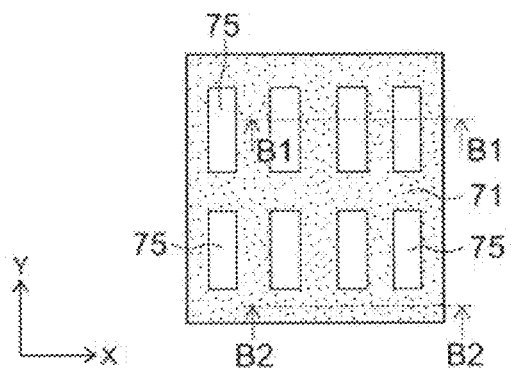
FIGS. 14A to 14C are views illustrating the fabrication process of the nonvolatile semiconductor memory device according to the first modification.
Figure 14B:
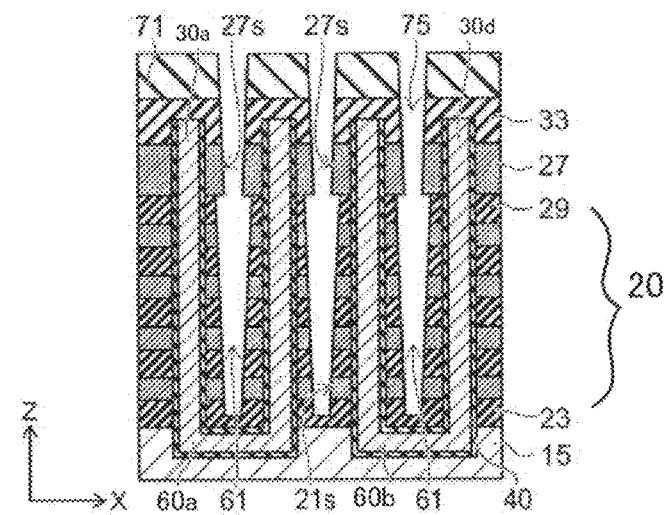
Figure 14C:
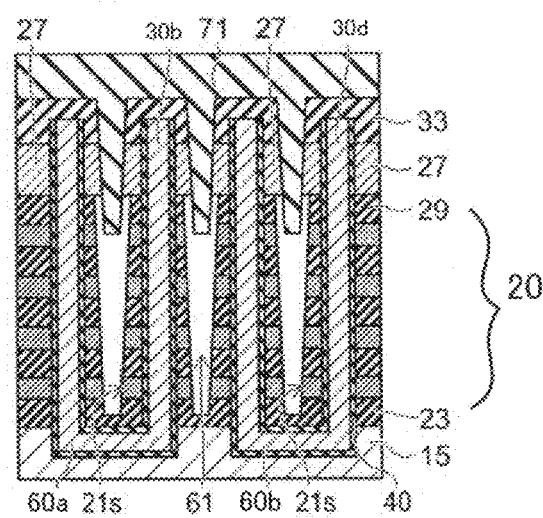

FIGS. 14A to 14C are views illustrating the silicidized conductors (word line) 21 and conductors (selection gate) 27. FIG. 14A is a top view, and FIG. 14B is a cross-sectional view taken along a line B1-B1 shown in FIG. 14A. FIG. 14C is a cross-sectional view taken along a line B2-B2 shown in FIG. 14A.

As illustrated in FIG. 14B, the end portions 21s of the conductors (word line) 21 exposed in the inner walls of the trenches 61 (the side surfaces of the stacks 20) and the end portions 27s of the conductors (selection gate) 27 exposed in the inner walls of the trenches 75 are silicidized. The silicidization may be performed not only for the end portions but also for the entire conductors (word line) 21 and conductors (selection gate) 27. On the other hand, in the portions where the insulating layer 71 remains, the end portions of the conductors (selection gate) 27 are covered with the extension portions of the insulating layer 71, and therefore, the conductors (selection gate) 27 are not silicidized.

The conductors (word line) 21 exposed in the side surfaces of the stacks 20 can be silicidized so as to have lower electric resistance also in the example illustrated in FIGS. 12A to 14C. Moreover, the conductors (selection gate) 27 exposed in the inner walls of the trenches 75 are also silicidized. Accordingly, the conductors (selection gate) 27 include the end portions 27s discontinuously silicidized in the direction Y. Moreover, the beam portions of the insulating layer 71 can support the stacks 20 and prevent the stacks 20 from collapsing in the silicidization process.

Figure 15A:
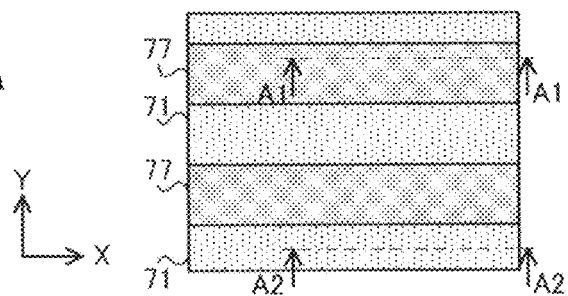
FIGS. 15A to 15C are views illustrating a fabrication progress of a nonvolatile semiconductor memory device according to a second modification.
Figure 15B:
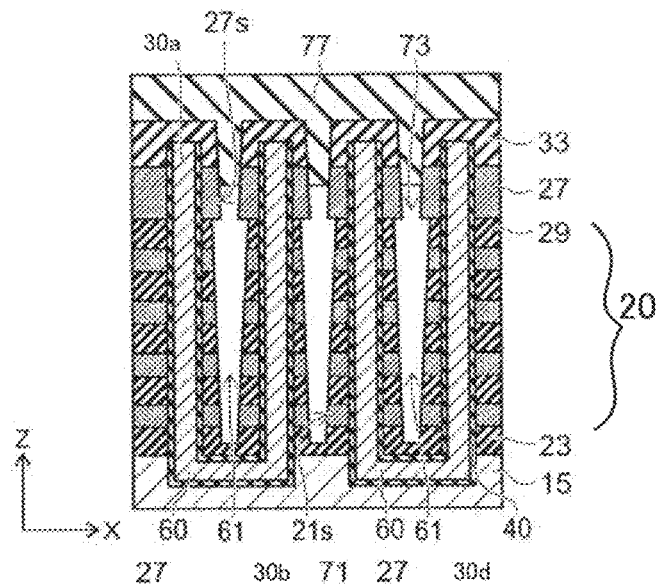
Figure 15C:
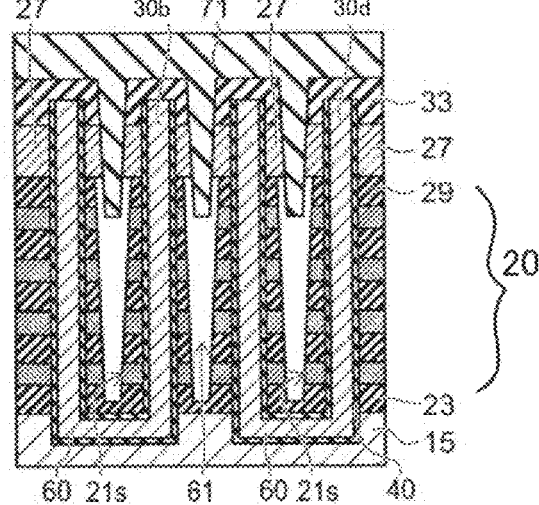

FIGS. 15A to 15C are cross-sectional views illustrating a fabrication process of a second modification according to the first embodiment. FIG. 15A is a top view, and FIG. 15B is a cross-sectional view taken along a line A1-A1 shown in FIG. 15A. FIG. 15C is a cross-sectional view taken along a line A2-A2 shown in FIG. 15A.

For example, it is possible to form an insulating layer 77 closing the trenches 73 or 75 following the fabrication process illustrated in FIGS. 10A to 10C or FIGS. 14A to 14C without forming the insulating layers 31 within the trenches 61.

A Plasma CVD method is used, for example, to form a silicon oxide film on the insulating layers 33, 71. In this process, the film is thick in upper portions of the trenches 73 or 75, and the trenches 73 or 75 can be closed with the insulating layer 77 with voids 79 left in the trenches 61. Subsequently, the insulating layer 77 is etched back to expose the insulating layer 71.

As illustrated in FIG. 15B, the trenches 73 are closed by the insulating layer 77. On the other hand, as illustrated in FIG. 15C, the stripe patterns of the insulating layer 71 arranged side by side in the direction Y remain closing the trenches 61, so that the voids 79 can be formed between the adjacent stacks 20. The voids 79 can reduce the parasitic capacitance of the conductors (word line) 21 included in the stacks 20, thus increasing the transmission speed of signals driving the memory cells. It is therefore possible to increase the speed at which data is read from or written in each memory cell.

A nonvolatile semiconductor memory device according to a second embodiment and a method of fabricating the same nonvolatile semiconductor device will be described with reference to the drawings. FIGS. 16A to 20C are views illustrating a method of fabricating a nonvolatile semiconductor memory device 200 according to the second embodiment. The nonvolatile semiconductor memory device 200 has a same structure as that of the nonvolatile semiconductor memory device 100 of the first embodiment illustrated in FIG. 1.

Figure 16A:
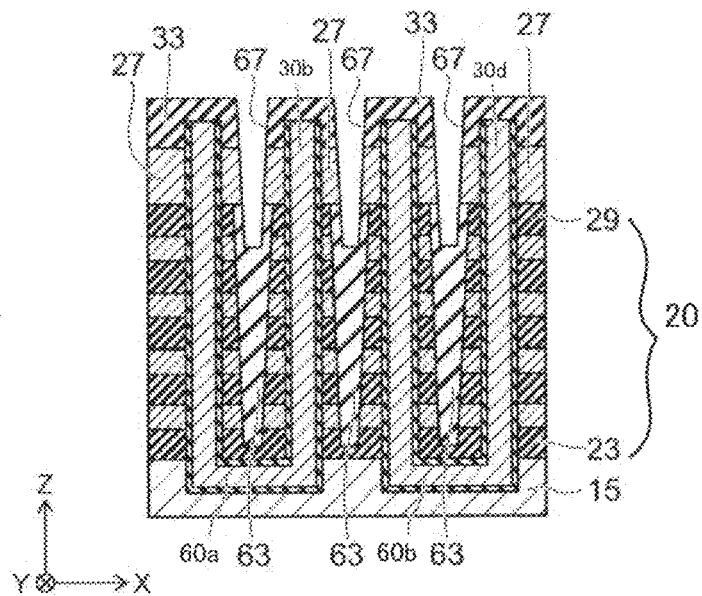
FIGS. 16A and 16B are cross-sectional views illustrating the fabrication process of a nonvolatile semiconductor memory device according to a second embodiment.

FIG. 16A is a cross-sectional view illustrating trenches 67 formed from the top surface of the insulating layer 33 so as to communicate with the sacrificial layer 63. The trenches 67 extend in the direction Y and divide a conductive film 28 into the plurality of conductors (selection gate) 27.

Figure 16B:
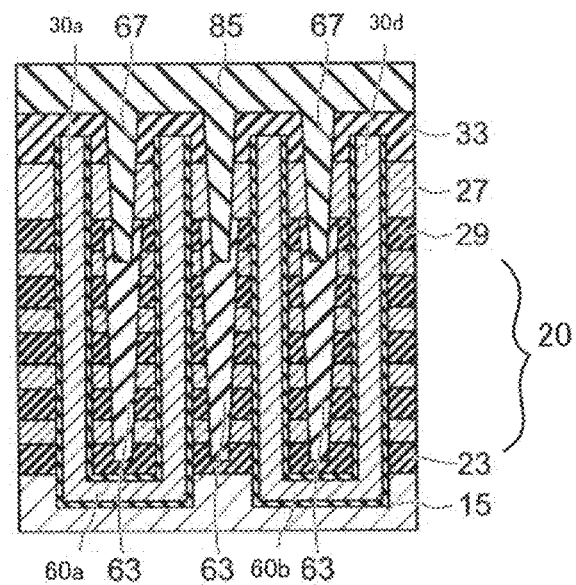

Subsequently, as illustrated in FIG. 16B, a sacrificial layer 85 is formed on the insulating layer 33. The sacrificial layer 85 fills the trenches 67 and covers the insulating layer 33. The sacrificial layer 85 can be made of a same material as that of the sacrificial layer 63, for example, a silicon nitride film.

Figure 17A:
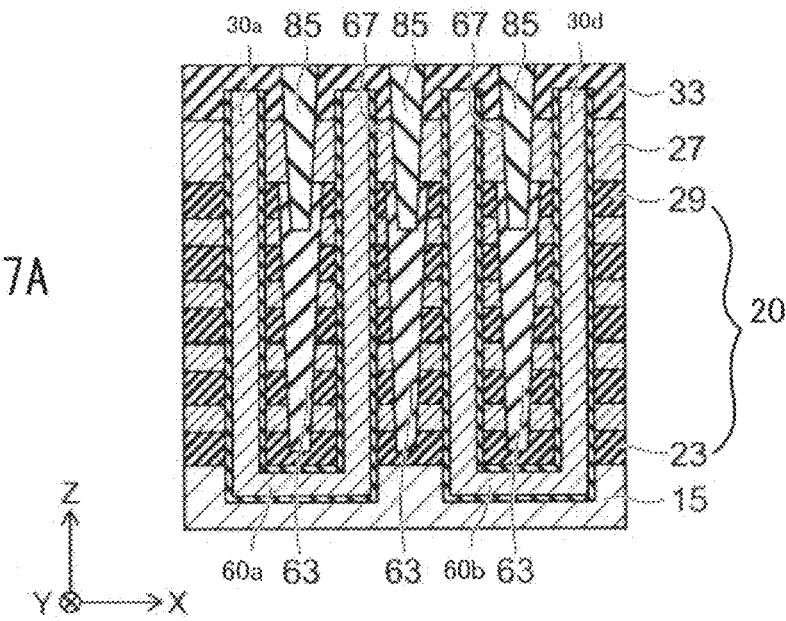
FIGS. 17A and 17B are cross-sectional views illustrating the fabrication process of the nonvolatile semiconductor memory device according to the second embodiment.

FIG. 17A is a schematic cross-sectional view illustrating the sacrificial layer 85 buried in the trenches 67. For example, the sacrificial layer 85 formed on the insulating layer 33 is etched back all over the surface to expose the insulating layer 33. The sacrificial layer 85 can be thereby buried in the trenches 67 (between the pairs of adjacent conductors (selection gate) 27).

In the example illustrated in FIG. 17A, the upper surface of the insulating layer 33 is at the same height as the upper surface of the sacrificial layer 85. However, the embodiment is unnecessarily limited to such a configuration. For example, the upper surface of the sacrificial layer 85 can be set lower than the upper surface of the insulating layer 33. However, it is desirable that the upper surface of the sacrificial layer 85 is located above the upper ends of the conductors (selection gate) 27.

Figure 17B:
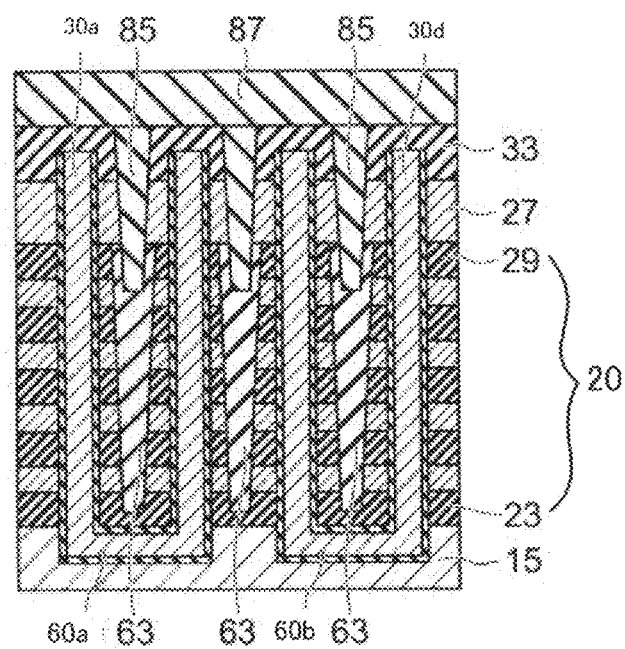

Subsequently, as illustrated in FIG. 17B, an insulating layer 87 covering the insulating layer 33 and sacrificial layer 85 is formed. The insulating layer 87 is composed of a material with an etching rate very much lower than the etching rate of the sacrificial layer 85. The insulating layer 87 is a silicon oxide film, for example.

Figure 18A:
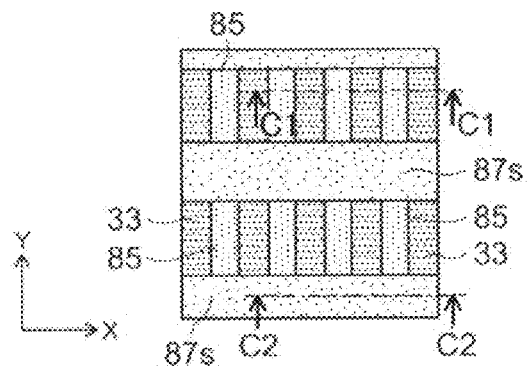
FIGS. 18A to 18C are views illustrating the fabrication process of the nonvolatile semiconductor memory device according to the second embodiment.
Figure 18B:
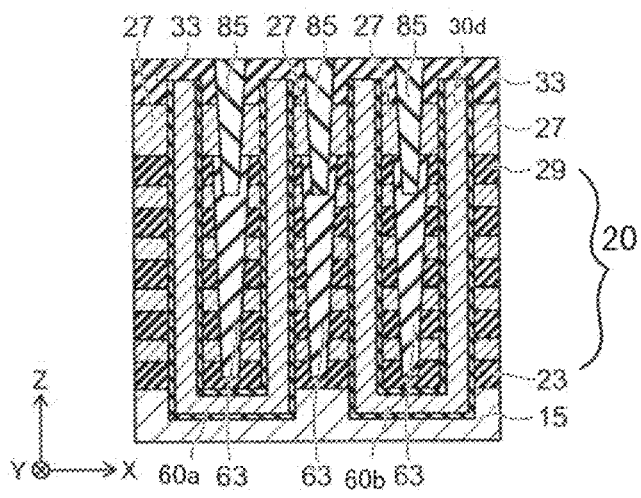
Figure 18C:
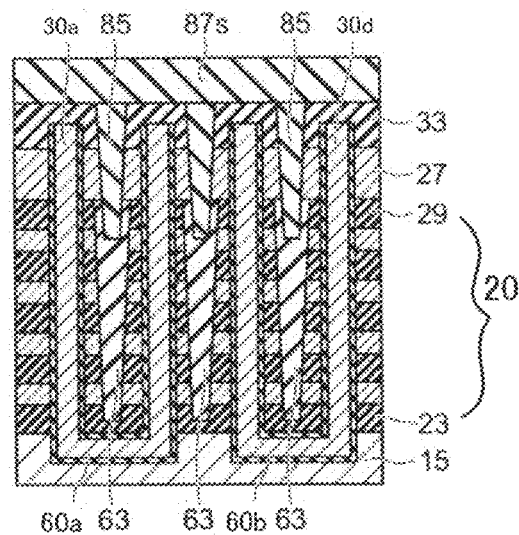

FIGS. 18A to 18C are views illustrating the insulating layer 87 etched in stripes. FIG. 18A is a top view, and FIG. 18B is a cross-sectional view taken along a line C1-C1 shown in FIG. 18A. FIG. 18C is a cross-sectional view taken along a line C2-C2 shown in FIG. 18A.

As illustrated in FIG. 18A, the insulating layer 87 is selectively etched to form a plurality of insulating layer stripe patterns 87s (beam portions) extending in the direction X, thus partially exposing the insulating layer 33 and sacrificial layer 85 between the insulating layer stripe patterns 87s adjacent in the direction Y.

As illustrated in FIG. 18B, the sacrificial layer 85 is formed so as to be connected to the sacrificial layer 63. As illustrated in FIG. 18C, the vertical sections of the sacrificial layer 63 and the sacrificial layer 85 connected to the sacrificial layer 63 are provided under the insulating layer stripe patterns 87s.

Figure 19A:
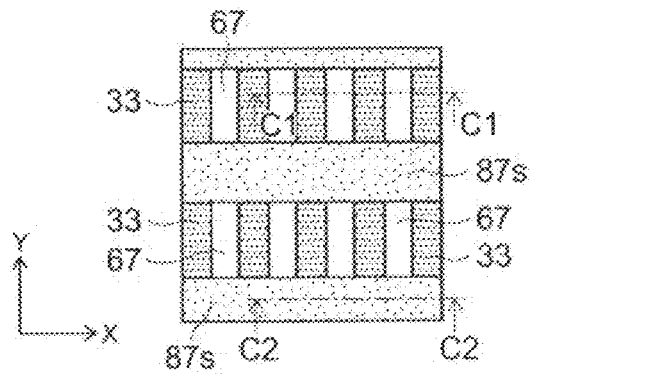
FIGS. 19A to 19C are views illustrating the fabrication process of the nonvolatile semiconductor memory device according to the second embodiment.
Figure 19B:
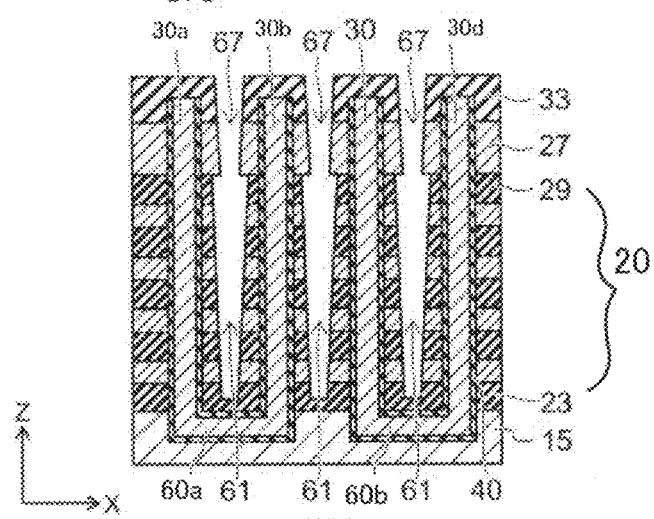
Figure 19C:
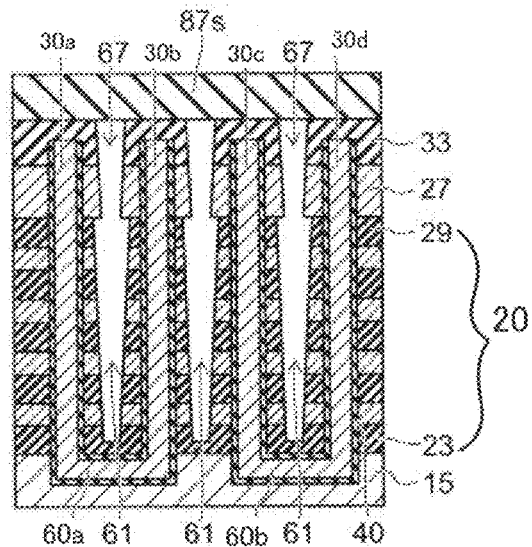

FIGS. 19A to 19C are views illustrating the state where the sacrificial layers 63 and 85 are selectively removed so that the trenches 61 and 67 are reproduced. FIG. 19A is a top view, and FIG. 19B is a cross-sectional view taken along a line C1-C1 shown in FIG. 19A. FIG. 19C is a cross-sectional view taken along a line C2-C2 shown in FIG. 19A.

As illustrated in FIG. 19B, the sacrificial layer 85 is selectively etched to reproduce the trenches 67. Furthermore, the sacrificial layer 63 is selectively removed with etching liquid supplied through the trenches 67. As illustrated in FIG. 19C, the sacrificial layer 85 and sacrificial layer 63 are removed to reproduce the trenches 61 and trenches 67 also under the insulating layer stripe patterns 87s.

FIGS. 20A to 20C are views illustrating the silicidized conductors (word line) 21 and conductors (selection gate) 27. FIG. 20A is a top view, and FIG. 20B is a cross-sectional view taken along a line C1-C1 shown in FIG. 20A. FIG. 20C is a cross-sectional view taken along a line C2-C2 shown in FIG. 20A.

As illustrated in FIG. 20B, the end portions 21s of the conductors (word line) 21 exposed in the inner walls of the trenches 61 (the side surfaces of the stacks 20) and the end portions 27s of the conductors (selection gate) 27 exposed in the inner walls of the trenches 67 are silicidized. As illustrated in FIG. 20C, the end portions 21s of the conductors (word line) 21 exposed in the inner walls of the trenches 61 and the end portions 27s of the conductors (selection gate) 27 exposed in the inner walls of the trenches 67 are silicidized also under the insulating layer 87. Silicidization may be performed not only for the end portions 21s, 27s but also for the entire conductors (word line) 21 and conductors (selection gate) 27 also in this case.

As described above, according to the second embodiment, the conductors (word line) 21 and conductors (selection gate) 27 are both silicidized and thereby have lower electric resistances. In the case described above, the conductive layers 27 (selection gates) can be silicidized continuously in the direction Y. The insulating layer stripe patterns 87s (beam portions) support the stacks 20 and prevent the stacks 20 from collapsing in the silicidization process.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a nonvolatile semiconductor memory device including:

a plurality of stacks arranged side by side in a first direction, and extending in a second direction orthogonal to the first direction, in a plane in parallel with a substrate, each stack including a plurality of first conductive layers stacked above the substrate with insulating layers interposed between the first conductive layers;

a second conductive layer provided on the stack; and a plurality of first memory strings including a first semiconductor pillar, a second semiconductor pillar and a first connection portion, respectively, the first and second semiconductor pillars penetrating each stack in a way to reach a back gate layer above the substrate, the first connection portion being provided in a surface of the back gate layer, one end of the first connection portion being connected to a lower end of the first semiconductor pillar, the other end of the first connection portion being connected to a lower end of the second semiconductor pillar, a memory layer being provided in an outer side portion of the first semiconductor pillar, the second semiconductor pillar and the first connection portion, a first semiconductor layer being provided in an inner side portion of the first semiconductor pillar, the second semiconductor pillar and the first connection portion, and the first memory strings being arranged side by side in the second direction, the method comprising the steps of:

burying a first sacrificial layer in each of a plurality of first trenches penetrating to the first conductive layer at the lowest layer of the stack;

forming the second conductive layer and a first insulating layer on the stack and the first sacrificial layers;

forming the first semiconductor pillar and second semiconductor pillar alternately arranged between the pairs of two first trenches adjacent to each other and forming the first connection portion connecting the first and second semiconductor pillars;

forming second trenches penetrating the first insulating layer and the second conductive layer above the first trenches to reach the stack and forming a second insulating layer on the second trenches and the first insulating layer to fill the second trenches;

removing a part of the second insulating layer in a first region extending in the first direction orthogonal to a third direction that the first and second semiconductor pillars extend while leaving a part of the second insulating layer in a second region adjacent to the first region in the second direction; and selectively removing the first sacrificial layer to silicidize the first and second conductive layers exposed in the first and second trenches.

2. The method according to claim 1, further comprising a step of:

after the silicidization, embedding a third insulating layer in the exposed first and second trenches.

3. The method according to claim 1, wherein
the back gate layer is provided on an underlying layer including a substrate and an interlayer insulating layer.

4. The method according to claim 1, wherein
the first and second semiconductor pillars are linearly-arranged side by side in the second direction.

5. The method according to claim 1, wherein
the first semiconductor layer is composed of a polycrystalline silicon.

6. The method according to claim 1, wherein
the first and second conductive layers are composed of a polycrystalline silicon.

7. The method according to claim 6, wherein
the silicidization is performed using any one of nickel (Ni), cobalt (Co), titanium (Ti), tantalum (Ta), and tungsten (W).

8. The method according to claim 1, wherein
the first sacrificial layer is composed of a silicon nitride ($Si_3N_4$) film, the first insulating layer is composed of a tantalum oxide film ($TaO_x$ film) or a stacked film which is stacked a tantalum oxide film ($TaO_x$ film) on a silicon dioxide film ($SiO_2$ film), and the second insulating layer is composed of a silicon oxide film ($SiO_2$).

9. The method according to claim 8, wherein
the first sacrificial layer is selectively removed using phosphoric acid ($H_3PO_4$) solution.

10. The method according to claim 1, wherein
the nonvolatile semiconductor memory device is a three-dimensional NAND flash memory.

* * * * *